US006236053B1

(12) United States Patent
Shariv

(10) Patent No.: US 6,236,053 B1
(45) Date of Patent: May 22, 2001

(54) CHARGED PARTICLE DETECTOR

(75) Inventor: Isaac Shariv, Ramat Hasharon (IL)

(73) Assignee: El-MUL Technologies Ltd., Yavne (IL)

(*) Notice: Subject to any disclaimer, the term of this patent is extended or adjusted under 35 U.S.C. 154(b) by 0 days.

(21) Appl. No.: 09/223,365

(22) Filed: Dec. 30, 1998

(30) Foreign Application Priority Data

May 5, 1998 (IL) .......................................... 124333

(51) Int. Cl.[7] ................................................. H01J 37/244
(52) U.S. Cl. ..................... 250/397; 250/310; 250/396 R; 250/505.1
(58) Field of Search ..................... 250/397, 310, 250/396 R, 505.1

(56) References Cited

U.S. PATENT DOCUMENTS 4,958,079 * 9/1990 Gray ...................................... 250/397
5,945,672 * 8/1999 Knowles et al. ...................... 250/310

* cited by examiner

Primary Examiner—Teresa M. Arroyo
Assistant Examiner—Nikita Wells
(74) Attorney, Agent, or Firm—Marshall, O'Toole, Gerstein, Murray & Borun

(57) ABSTRACT

A device for directing a primary particle beam at a sample and detecting particles in accordance with the emergence of particles from the sample. The device comprises a source for generating the primary beam and a passage leading from the source to the sample. It has one end towards the source and a second end towards the sample and, alongside the passage, is placed a particle detector having a face for receiving particles to be detected. At the first end of the passage is placed a cover suitable for generating secondary electrodes, which has a central aperture for admitting the primary beam. The particle detector is orientated with the face for receiving particles towards the cover.

11 Claims, 3 Drawing Sheets

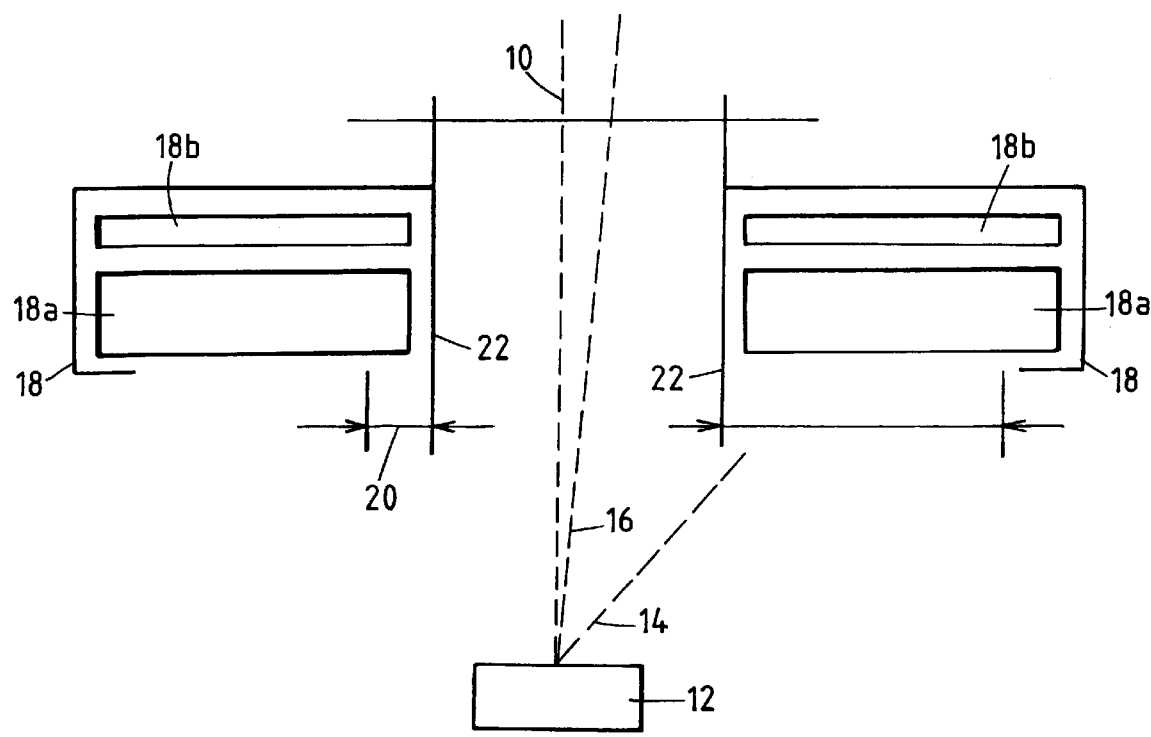
FIG. 1
FIG. 2
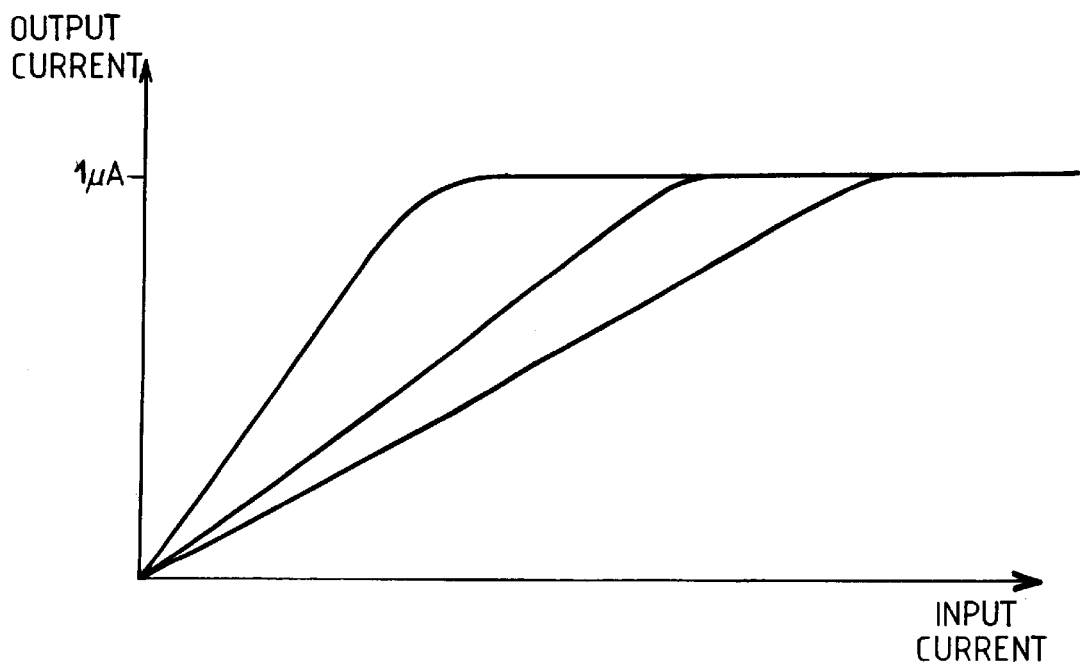

CHARGED PARTICLE DETECTOR

FIELD OF THE INVENTION

The present invention relates to charged particle detectors and more particularly but not exclusively to detectors that form part of, or are used with, electron microscopes, and the configuration of the detectors within the electron microscopes.

BACKGROUND OF THE INVENTION

An electron microscope of the prior art is shown in FIG. 1. In this arrangement a beam of electrons is passed down a central passage following the line of arrow 10. This beam is the primary beam that strikes a sample 12. Particles of different types return from the sample and may follow a range of paths. It is to be noted that, throughout the present specification the term "return" is used in relation to particles traveling from a sample broadly in the opposite direction to the primary beam and includes primary particles that strike the sample and bounce off as well as secondary particles that are emitted from the sample after being struck by particles of the primary beam.

Arrows 14 and 16 show two exemplary paths that returning electrons may take. Those electrons taking path 14 strike detector 18. In the example shown the detector is an MCP or micro-channel plate detector and comprises a micro-channel plate but it may also be a pair of MCPs or a triple stack of MCPs 18a and an anode 18b. An MCP detector is shown because several of the problems given below are specific to MCP or MSP (micro-sphere plate) detectors. However the broad principle of the invention applies to any kind of detector that can be used in an electron microscope.

Electrons that follow path 16, however, do not strike the MCP and thus cannot be detected because a detector cannot be placed in the path of the primary beam. Furthermore any electrons that follow a path leading to dead area 20 cannot be detected either and the reason for this is as follows: The MCPs 18 must be held at a high voltage in order to attract particles and cause particle multiplication effects. Such voltages are sufficiently high to interfere with the primary beam 10 on its way to the sample and therefore the central passageway has to be shielded from the voltage. This is achieved by using a shielding tube 22, the walls of which are relatively thick. It would on the face of it be attractive to make the central passage long and thin, however a certain amount of interaction between the beam and the walls always occurs, resulting in deflection of the beam. Thus a minimum limit on the diameter of the central passageway of a significant fraction of the length of the tube is generally adhered to in order to minimize the interaction. As the length of the tube cannot be reduced below the thickness of the detectors 18 this sets a limit on how small the central passageway can be made.

In addition to the dead area caused by the central passageway itself that part of the detector immediately adjacent to the tube walls 22 cannot be charged to the voltage necessary to work, since it will cause a voltage breakdown at the wall 22, which is at a different potential. Therefore the dead area 20, in which no detection is possible, is relatively large and is particularly problematic in some applications in which important information is carried by those electrons that return from the sample in trajectories close to the axis of the microscope.

A further problem with the standard arrangement is that particles that return directly from the sample, which may include both primary and secondary electrons, occupy a range of energies, from those so weak that they cannot be detected to those so strong that they cause damage to the detector. The detector has certain energies within which detection efficiency is a maximum and not all electrons can be manipulation to lie simultaneously within that range.

In addition the MCP is exposed to being struck by pollutants, dust particles and the like, which can shorten the life span of the MCP by, for example, coating the active surfaces of the micro-channels so that particle multiplication is impeded.

A further difficulty is that the MCP 18 is limited by a relatively low saturation current. FIG. 2 shows a characteristic of input against output current for a series of different gains and it will be seen that no matter what the gain, an absolute saturation value of around $1\mu A$ applies.

SUMMARY OF THE INVENTION

It is an object of the invention to alleviate the above problems.

According to a first aspect of the present invention there is provided a device for directing a primary particle beam at a sample and detecting particles in accordance with the emergence of particles from the sample. The device comprises a source for generating the primary beam and a passage leading from the source to the sample and having a first end towards the source and a second end towards the sample and wherein, alongside the passage, is placed at least one particle detector having a face for receiving particles to be detected, characterized in that at the first end of the passage is placed a cover suitable for generating secondary electrons and having a central aperture for admitting the primary beam and in that the at least one particle detector is orientated with the face for receiving particles towards the cover.

The primary particles beam may be focused within the aperture and shielding may be provided around the passage. The primary particle beam is preferably kept away from the shielding. The detector may be placed adjacent the shielding and may be provided with a voltage necessary for carrying out detection across the whole of the detector including that portion of the detector adjacent the shielding.

The cover is preferably sufficiently thin that interaction between the primary beam and walls of the aperture is minimal. The cover may be made of BeCu, which is a material that has a high yield of secondary electrons.

According to a second aspect of the invention there is provided a detector for charged particles having a face for receiving charged particles, a particle multiplier plate located at the face, a reflector located behind the plate with respect to the face and a grid anode located between the plate and the reflector.

Preferably the plate, the grid anode and the reflector are all charged and the grid anode is charged to a voltage substantially higher than the plate, and the reflector is charged to a volume moderately lower than the grid anode.

The reflector is made of a material suitable for producing secondary electrons, for example BeCu or conductive diamond.

BRIEF DESCRIPTION OF THE DRAWINGS

For a better understanding of the invention and to show how the same may be carried into effect, reference will now be made, purely by way of example, to the accompanying drawings in which, FIG. 1 shows an arrangement of detectors within a prior art electron microscope, FIG. 2 shows the input/output characteristic of a prior art MCP.

DESCRIPTION OF THE PREFERRED EMBODIMENTS

FIG. 1 shows the internal arrangement of parts in an electron microscope of the prior art and FIG. 2 shows a typical characteristic of a prior art MCP detector such as detector 18 of FIG. 1.

Figure 3:
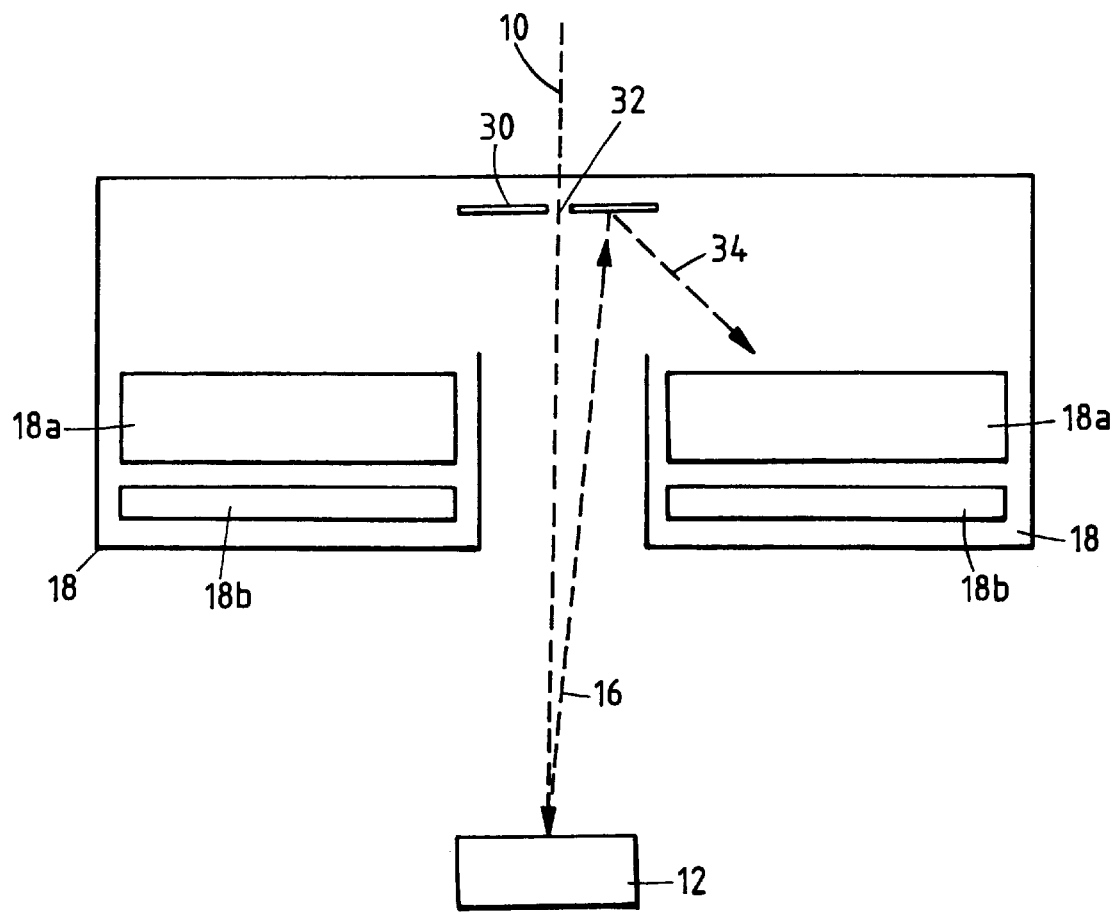
FIG. 3 shows an arrangement of detectors within an electron microscope according to a first embodiment of the present invention.

FIG. 3 shows the internal arrangement of parts in an electron microscope operative according to a first embodiment of the present invention. Those parts which are the same as those in earlier figures are given identical reference numbers and are not discussed again save as is necessary to explain the workings of the invention. In FIG. 3 the detectors 18 are arranged to face away from the sample 12. The top of the central passage has a covering 30 of material that is chosen for its high yield of secondary electrons. As example of such a material is BeCu.

The covering 30 has a central aperture 32 that allows the primary beam to enter the central passage and follow the path of arrow 10 towards the sample 12. The covering itself can be less than 1 mm so that the walls of the aperture 32 do not interact significantly with the primary beam. The cover may be active to its innermost edge, leaving no dead area around the hole in it. The diameter of the shielding tube in aperture 32 is sufficiently large, that the primary beam is kept well away from the walls of the shielding tube 22. The primary beam strikes the sample, and returning particles that follow the path of arrow 16 proceed to the lower surface of cover 30, which may be charged in order to attract the particles. It will be recalled that cover 30 has been chosen from a material that is optimal for emitting secondary electrons when struck by energetic particles, and the secondary electrons thus emitted make their way along the line of arrow 34 until they strike the detector 18. The face of the detector 18 is held at a high potential, preferably between +50V and +500V, with respect to the cover 30, in order to accelerate the secondary electrons towards it, and this, together with the high secondary electron yield of the cover, combines to ensure that there is efficient detection of particles from 0eV right up to 50 keV.

A particular feature of the embodiment is that, although the particles that return from the sample may be spread over a whole range of energies, the secondary electrons that are emitted by the cover 30 are at a much narrower range of energies and the material can be chosen, in combination with the selection of the relative voltage levels of the detector, such that the range of energies of the secondary electron, when hitting the detectors, is within the region of maximum efficiency of the detector. Not only is detection efficiency improved but also the MCP is less likely to be struck by particles of extremely high energy that could damage the detector and reduce its lifetime. The internal surface of the cover is itself far less sensitive to bombardment by high energy particles.

A further feature of this embodiment is that the face of the detector is better protected from pollutants, dust particles and the like. As mentioned above the particles of pollutant tend to line the walls of the micro-channels or the microspheres and interfere with the electron multiplication action which is the whole basis of the detection process. This provides a further limitations on the lifetime of the detector, but the effect is considerably reduced in the present embodiment as the face of the detector 18 is directed inwardly.

Figure 4:
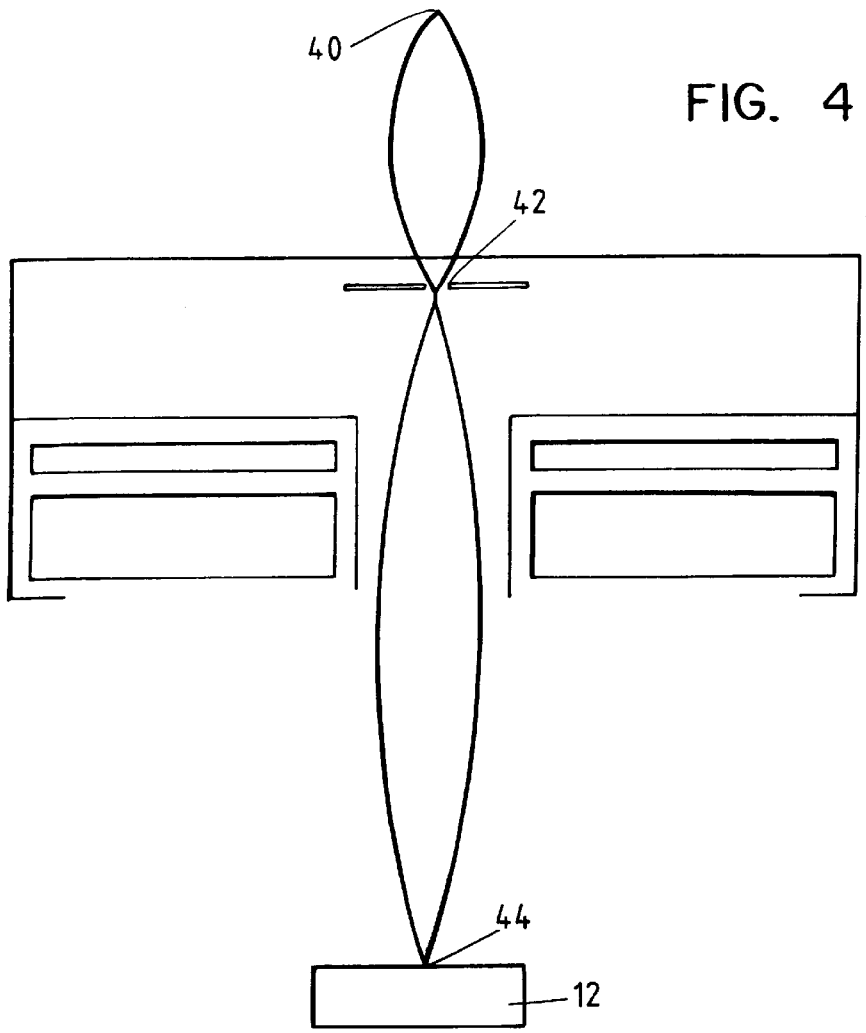
FIG. 4 shows a particle beam passing through an arrangement of the type shown in FIG. 3.

FIG. 4 shows the path of a realistic primary beam through the central passage. A realistic beam does not follow a straight line path as suggested by arrow 10 in the earlier figures but rather needs to be focused. FIG. 4 shows how the beam is emitted from a source 40 and brought to a focus at a first focal point 42. In order to minimize the size of the aperture 32 the focal point 42 is preferably arranged to coincide with the aperture 32.

In a further embodiment it is possible to replace the anode 18b by a scintillator followed by a light guide and a photo-multiplier tube. This has the advantage of enhancing the sensitivity of a scintillator-based detector so that it can detect small numbers of particles or low energy particles. This is because the scintillator is struck, not by the single particle or by the low energy particle but by the cloud of particles produced in the MCP by particle multiplication. Furthermore one of the disadvantages of the MCP is that the output signal is at a high voltage and needs to the buffered. By using a scintillator instead of an anode to produce the output, buffering occurs automatically because the signal is converted into photons.

Figure 5:
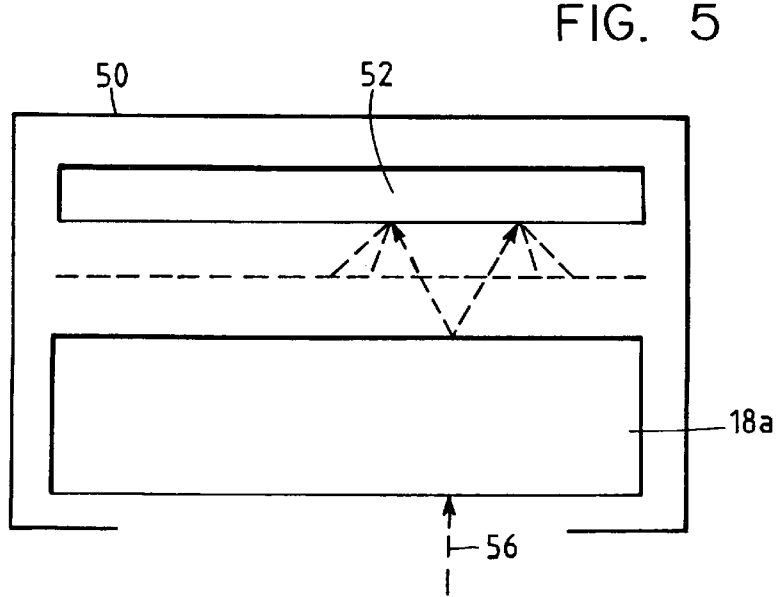
FIG. 5 shows a detector according to a second aspect of the present invention.

FIG. 5 shows an embodiment of a detector 50 operative in accordance with a further aspect of the present invention. An MCP plate (or MSP plate) 18a is placed at the face of the detector as in the prior art detector shown in FIG. 1. However instead of an anode being placed at the far end a reflector 52 is located in this position, that is to say at the back of the detector. The reflector is chosen from materials that have a good yield of secondary electrons, for example BeCu of conductive diamond. A grid anode 54 is placed between the MCP 18a and the reflector 52.

In use an incoming particle, represented by arrow 56, is multiplied within the MCP 18a and accelerated through the grid anode 54, which may for example be held at +500V relative to the MCP. Most of the electrons emerging from the rear side of the MCP are not stopped by the grid anode 54 and instead go on to strike the reflector 52. Upon impact with the reflector several, perhaps between 3 and 10, secondary electrons are generated. As these are secondary electrons they leave the reflector at zero energy. The reflector 52 itself is held at a relative voltage to the grid anode of typically –100V. Thus, although the secondary electrons are accelerated towards the grid anode they do not continue past it to the MCP 18a but are instead absorbed by the grid anode to produce the anode current. The result of this is that the gain of the detector 50 can be from 3 to 10 times higher than the gain of the conventional detector with an anode, without encountering saturation problems.

It is appreciated that the various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

What is claimed is:

1. A device for directing a primary electron beam at a sample and detecting electrons in accordance with the emergence of electrons from the sample, said device comprising a source for generating said primary beam and a passage leading from said source to said sample and having a first end towards said source and a second end towards said sample and wherein alongside said passage is placed at least one microchannel plate electron detector having a face for receiving electrons to be detected, wherein at said first end of said passage is placed a cover suitable for generating secondary electrons and having a central aperture for admitting said primary beam and wherein said at least one electron detector is orientated with said face for receiving electrons towards said over.

2. A device according to claim 1 wherein said primary electrons beam is focused within said aperture.

3. A device according to claim 1 wherein shielding is provided around said passage and said primary electron beam is kept away from said shielding.

4. A device according to claim 3 wherein said detector is placed adjacent said shielding and is provided with a voltage necessary for carrying out detection across the portion of the detector adjacent said shielding.

5. A device according to claim 1, wherein said cover is sufficiently thin that interaction between said primary beam and walls of said aperture is minimal.

6. A device according to claim 1, wherein said cover is made of one member of a group comprising conductive diamond and BeCu.

7. A device according to claim 1, wherein said detector has a face for receiving charged electrons, a electron multiplier plate located at said face, a reflector, located behind said plate with respect to said face, and a grid anode located between said plate and said reflector.

8. A detector for charged electrons having a face for receiving charged electrons, a microchannel electron multiplier plate located at said face, a reflector located behind said plate with respect to said face and a grid anode located between said plate and said reflector.

9. A detector according to claim 8 wherein said plate, said grid anode and said reflector are all charged and wherein said grid anode is charged to a voltage substantially higher than said plate, and said reflector is charged to a voltage moderately lower than said grid anode.

10. A detector according to claim 8, wherein said reflector is made of a material suitable for producing secondary electrons.

11. A detector according to claim 10, wherein said reflector is made of one of a group of materials comprising BaCu and conductive diamond.

* * * * *

UNITED STATES PATENT AND TRADEMARK OFFICE
CERTIFICATE OF CORRECTION

PATENT NO. : 6,236,053 B1
DATED : May 22, 2001
INVENTOR(S) : Isaac Shariv

It is certified that error appears in the above-identified patent and that said Letters Patent is hereby corrected as shown below:

<u>Column 6,</u>
Line 21, "BaCu" should be -- BeCu --.

Signed and Sealed this

Ninth Day of April, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO. : 6,236,053 B1  Page 1 of 1
DATED : May 22, 2001
INVENTOR(S) : Isaac Sharif It is certified that error appears in the above-identified patent and that said Letters Patent is hereby corrected as shown below:

<u>Title page,</u>
Item [73] Assignee, "E1-MUL" should be -- EL-MUL --

Signed and Sealed this

Twenty-eighth Day of May, 2002

Attest:

JAMES E. ROGAN
*Attesting Officer*    *Director of the United States Patent and Trademark Office*